US012720963B2

(12) United States Patent
Li

(10) Patent No.: US 12,720,963 B2
(45) Date of Patent: Aug. 25, 2026

(54) MANUFACTURING METHOD OF SEMICONDUCTOR STRUCTURE

(71) Applicant: United Microelectronics Corp., Hsinchu (TW)

(72) Inventor: Shin-Hung Li, Nantou County (TW)

(73) Assignee: United Microelectronics Corp., Hsinchu (TW)

( * ) Notice: Subject to any disclaimer, the term of this patent is extended or adjusted under 35 U.S.C. 154(b) by 385 days.

(21) Appl. No.: 18/466,855

(22) Filed: Sep. 14, 2023

(65) Prior Publication Data

US 2025/0072221 A1 Feb. 27, 2025

(30) Foreign Application Priority Data

Aug. 24, 2023 (TW) ................................ 112131965

(51) Int. Cl.
*H10K 59/122* (2023.01)
*H10K 59/173* (2023.01)
*H10K 71/60* (2023.01)
*H10P 50/28* (2026.01)

(52) U.S. Cl.
CPC ......... *H10K 59/122* (2023.02); *H10K 59/173* (2023.02); *H10K 71/60* (2023.02); *H10P 50/283* (2026.01)

(58) Field of Classification Search
CPC .... H10K 59/122; H10K 59/173; H10K 71/60; H01L 21/31111; H01L 21/31116; H01L 21/31144
USPC .......................................................... 438/597
See application file for complete search history.

(56) References Cited

U.S. PATENT DOCUMENTS 5,294,296 A * 3/1994 Yoon ................. H01L 21/76804 438/739
5,453,403 A * 9/1995 Meng ................ H01L 21/76804 257/E21.578
5,672,241 A * 9/1997 Tien .................. H01L 21/76804 257/E21.578
5,877,092 A * 3/1999 Lee ................... H01L 21/76804 438/743
6,458,710 B1 * 10/2002 Burke ............... H01L 21/31116 438/743
6,503,829 B2 * 1/2003 Kim .................. H01L 21/76804 257/E21.252

(Continued)

FOREIGN PATENT DOCUMENTS

CN 112490125 3/2021

*Primary Examiner* — Vu A Vu
(74) *Attorney, Agent, or Firm* — JCIPRNET

(57) ABSTRACT

A manufacturing method of a semiconductor structure including the following steps is disclosed. A definition layer is formed on a substrate. The definition layer includes a first dielectric layer and a second dielectric layer. A first isotropic etching process is performed on the second dielectric layer to form a first opening in the second dielectric layer. A portion of the first opening is located under the patterned photoresist layer. A first anisotropic etching process is performed on the first dielectric layer to form a second opening in the first dielectric layer. The first opening is connected to the second opening to form a third opening. The patterned photoresist layer is removed. An etch back process is performed on the first dielectric layer and the second dielectric layer, so that a sidewall of the definition layer exposed by the third opening is an inclined surface.

18 Claims, 10 Drawing Sheets

(56) References Cited

U.S. PATENT DOCUMENTS

| | | | | |
|---|---|---|---|---|
| 6,660,630 | B1 * | 12/2003 | Chang | H01L 21/76804 |
| | | | | 438/700 |
| 7,291,556 | B2 * | 11/2007 | Choi | H10N 70/826 |
| | | | | 257/E27.084 |
| 9,917,027 | B2 * | 3/2018 | Yi | H01L 23/3192 |
| 10,825,766 | B2 * | 11/2020 | Kim | H01L 21/76804 |

* cited by examiner

E3
10
112
116
114
110
108
106
104
102
100
R1
θ1
S1
S3
S2
S4
OP3
OP2
OP1
W1
W2

MANUFACTURING METHOD OF SEMICONDUCTOR STRUCTURE

CROSS-REFERENCE TO RELATED APPLICATION

This application claims the priority benefit of Taiwan application serial no. 112131965, filed on Aug. 24, 2023. The entirety of the above-mentioned patent application is hereby incorporated by reference herein and made a part of this specification.

BACKGROUND

Technical Field

This disclosure relates to a manufacturing method of a semiconductor structure, and in particular to a manufacturing method of a semiconductor structure including a definition layer.

Description of Related Art

In the semiconductor manufacturing process, a definition layer is used to define the formation position of the subsequently formed components. For example, in the manufacturing process of OLED on Silicon (OLEDoS) elements, openings are formed in the pixel definition layer (PDL) to define the formation positions of subsequently formed components (e.g., organic light emitting diode (OLED) layers and/or cathodes). However, when the angle between the sidewall and the lower surface of the pixel definition layer is too large, it may lead to fracture of the OLED layer and/or cathode subsequently formed at the corner of the pixel definition layer, and reduce the reliability of the silicon-based OLED element.

SUMMARY

The disclosure provides a manufacturing method of a semiconductor structure, capable of effectively preventing components (e.g., OLED layers and/or cathodes) subsequently formed on a definition layer from fracturing, thereby enhancing reliability of a semiconductor element (e.g., a silicon-based OLED element).

The disclosure proposes a manufacturing method of a semiconductor structure including the following. A substrate is provided. A definition layer is formed on the substrate. The definition layer includes a first dielectric layer and a second dielectric layer. The first dielectric layer is located on the substrate. The second dielectric layer is located on the first dielectric layer. A first isotropic etching process is performed on the second dielectric layer by using the patterned photoresist layer as a mask to form a first opening in the second dielectric layer. A portion of the first opening is located under the patterned photoresist layer. A first anisotropic etching process is performed on the first dielectric layer by using the patterned photoresist layer as a mask to form a second opening in the first dielectric layer. The first opening is connected to the second opening to form a third opening in the definition layer. The patterned photoresist layer is removed. An etch back process is performed on the first dielectric layer and the second dielectric layer, so that a sidewall of the definition layer exposed by the third opening is an inclined surface.

According to an embodiment of the disclosure, in the manufacturing method of the semiconductor structure, in the first isotropic etching process, an etching rate of the second dielectric layer may be greater than an etching rate of the first dielectric layer.

According to an embodiment of the disclosure, in the manufacturing method of a semiconductor structure, the first dielectric layer may be a single-layer structure.

According to an embodiment of the disclosure, in the manufacturing method of a semiconductor structure, the first dielectric layer may be a multi-layer structure.

According to an embodiment of the disclosure, in the manufacturing method of the semiconductor structure, the first dielectric layer may include multiple dielectric material layers.

According to an embodiment of the disclosure, in the manufacturing method of the semiconductor structure, in the first anisotropic etching process, multiple etching rates of the dielectric material layers may decrease from an uppermost layer of the dielectric material layers to a lowermost layer of the dielectric material layers.

According to an embodiment of the disclosure, in the manufacturing method of the semiconductor structure, an angle between the sidewall of the definition layer and a lower surface of the definition layer may be 20 degrees to 60 degrees.

According to an embodiment of the disclosure, in the manufacturing method of a semiconductor structure, an angle between the sidewall of the definition layer and a lower surface of the definition layer may be 30 degrees to 50 degrees.

According to an embodiment of the disclosure, in the manufacturing method of a semiconductor structure, a maximum width of the first opening may be greater than a maximum width of the second opening.

According to an embodiment of the disclosure, in the manufacturing method of a semiconductor structure, the first isotropic etching process may be a wet etching process.

According to an embodiment of the disclosure, in the manufacturing method of a semiconductor structure, the first anisotropic etching process may be a dry etching process.

According to an embodiment of the disclosure, in the manufacturing method of a semiconductor structure, the sidewall of the definition layer may include a sidewall of the first dielectric layer and a sidewall of the second dielectric layer.

According to an embodiment of the disclosure, in the manufacturing method of a semiconductor structure, the method of performing an etch back process on the first dielectric layer and the second dielectric layer may include that a second isotropic etching process is performed on the first dielectric layer and the second dielectric layer.

According to an embodiment of the disclosure, in the manufacturing method of a semiconductor structure, the second isotropic etching process may be a wet etching process.

According to an embodiment of the disclosure, in the manufacturing method of the semiconductor structure, the method of performing an etch back process on the first dielectric layer and the second dielectric layer may include that a second anisotropic etching process is performed on the first dielectric layer and the second dielectric layer.

According to an embodiment of the disclosure, in the manufacturing method of a semiconductor structure, the second anisotropic etching process may be a dry etching process.

According to an embodiment of the disclosure, the manufacturing method of the semiconductor structure may further include the following. An electrode layer is formed on the substrate. A third dielectric layer is formed on the electrode layer. A conductive layer is formed on the third dielectric layer. The conductive layer may be electrically connected to the electrode layer. The first dielectric layer may be formed on the third dielectric layer and the conductive layer.

According to an embodiment of the disclosure, in the manufacturing method of a semiconductor structure, the conductive layer may have a recess. The first dielectric layer may fill the recess.

According to an embodiment of the disclosure, in the manufacturing method of the semiconductor structure, the third opening may expose the conductive layer.

According to an embodiment of the disclosure, the manufacturing method of the semiconductor structure may further include the following. A fourth dielectric layer is formed on the substrate. A plug is formed in the fourth dielectric layer. The electrode layer and the third dielectric layer may be formed on the fourth dielectric layer. The electrode layer may be electrically connected to the plug.

Based on the above, in the manufacturing method of a semiconductor structure proposed in the disclosure, the definition layer is formed on the substrate. The definition layer includes the first dielectric layer and the second dielectric layer. The first isotropic etching process is performed on the second dielectric layer by using the patterned photoresist layer as a mask to form the first opening in the second dielectric layer. A portion of the first opening is located under the patterned photoresist layer. The first anisotropic etching process is performed on the first dielectric layer by using the patterned photoresist layer as a mask to form the second opening in the first dielectric layer. The first opening is connected to the second opening to form the third opening in the definition layer. After the patterned photoresist layer is removed, the etch back process is performed on the first dielectric layer and second dielectric layer. The etch back process may eliminate a sharp corner of the first dielectric layer and a sharp corner of the second dielectric layer, so that the sidewall of the definition layer exposed by the third opening is an inclined surface. Since the sidewall of the definition layer formed by the method has a gentle slope, fracture of components (e.g., OLED layers and/or cathodes) subsequently formed on the definition layer may be effectively prevented, thereby enhancing reliability of a semiconductor element (e.g., a silicon-based OLED element).

To make the aforementioned more comprehensive, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Embodiments are enumerated below and described in detail with reference to the drawings, but the embodiments provided are not intended to limit the scope of the disclosure. In order to facilitate understanding, the same components will be described with the same symbols in the following description. In addition, the drawings are for illustrative purposes only and are not drawn to original size. In fact, the dimensions of the various features have been arbitrarily increased or decreased for clarity of discussion.

FIG. 1A to FIG. 1E are cross-sectional views of manufacturing processes of semiconductor structures according to some embodiments of the disclosure.

Figure 1A:
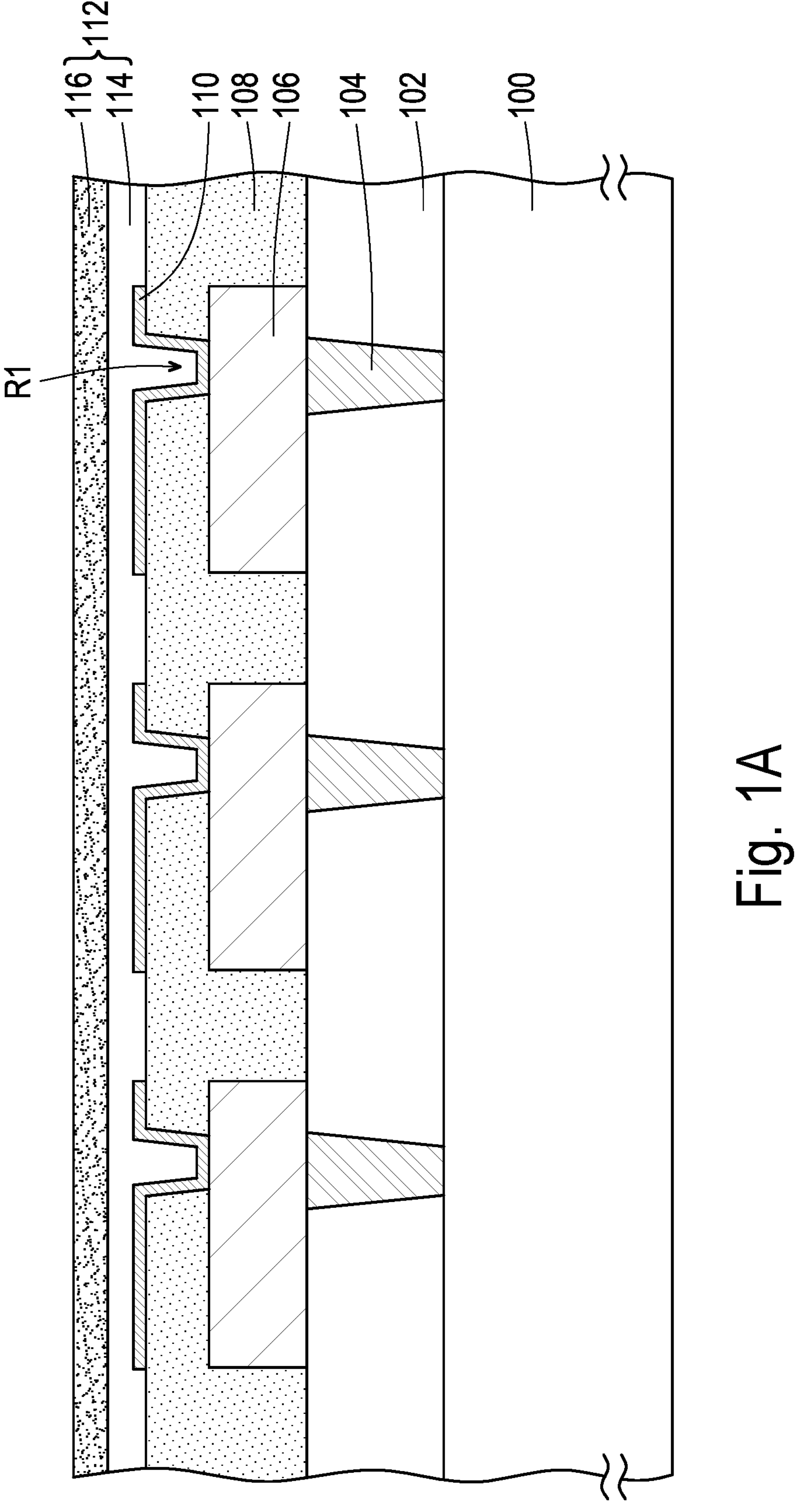
FIG. 1A to FIG. 1E are cross-sectional views of manufacturing processes of semiconductor structures according to some embodiments of the disclosure.

Referring to FIG. 1A, a substrate 100 is provided. In some embodiments, the substrate 100 may be a semiconductor substrate, such as silicon substrate. Next, a dielectric layer 102 may be formed on the substrate 100. The dielectric layer 102 may be a single-layer structure or a multi-layer structure. In some embodiments, a material of the dielectric layer 102 is, for example, silicon oxide, silicon nitride, or a combination thereof. A plug 104 may then be formed in the dielectric layer 102. In some embodiments, a material of the plug 104 is, for example, tungsten, titanium, titanium nitride, or a combination thereof.

Next, an electrode layer 106 may be formed on the substrate 100. In some embodiments, the electrode layer 106 may be formed on dielectric layer 102. In some embodiments, the electrode layer 106 may be formed on the plug 104. In some embodiments, the electrode layer 106 may be electrically connected to the plug 104. In some embodiments, the electrode layer 106 may be used as an anode of a silicon-based OLED element. In some embodiments, a material of the electrode layer 106 is, for example, metal materials such as aluminum or silver.

Subsequently, a dielectric layer 108 may be formed on electrode layer 106. In some embodiments, the dielectric layer 108 may be formed on dielectric layer 102. In some embodiments, a material of the dielectric layer 108 is, for example, silicon oxide. Afterwards, a conductive layer 110 may be formed on the dielectric layer 108. In some embodiments, the conductive layer 110 may be formed on the electrode layer 106. The conductive layer 110 may be electrically connected to the electrode layer 106. The conductive layer 110 may have a recess R1. In some embodiments, a material of the conductive layer 110 may be metal or indium tin oxide (ITO).

Figure 2A:
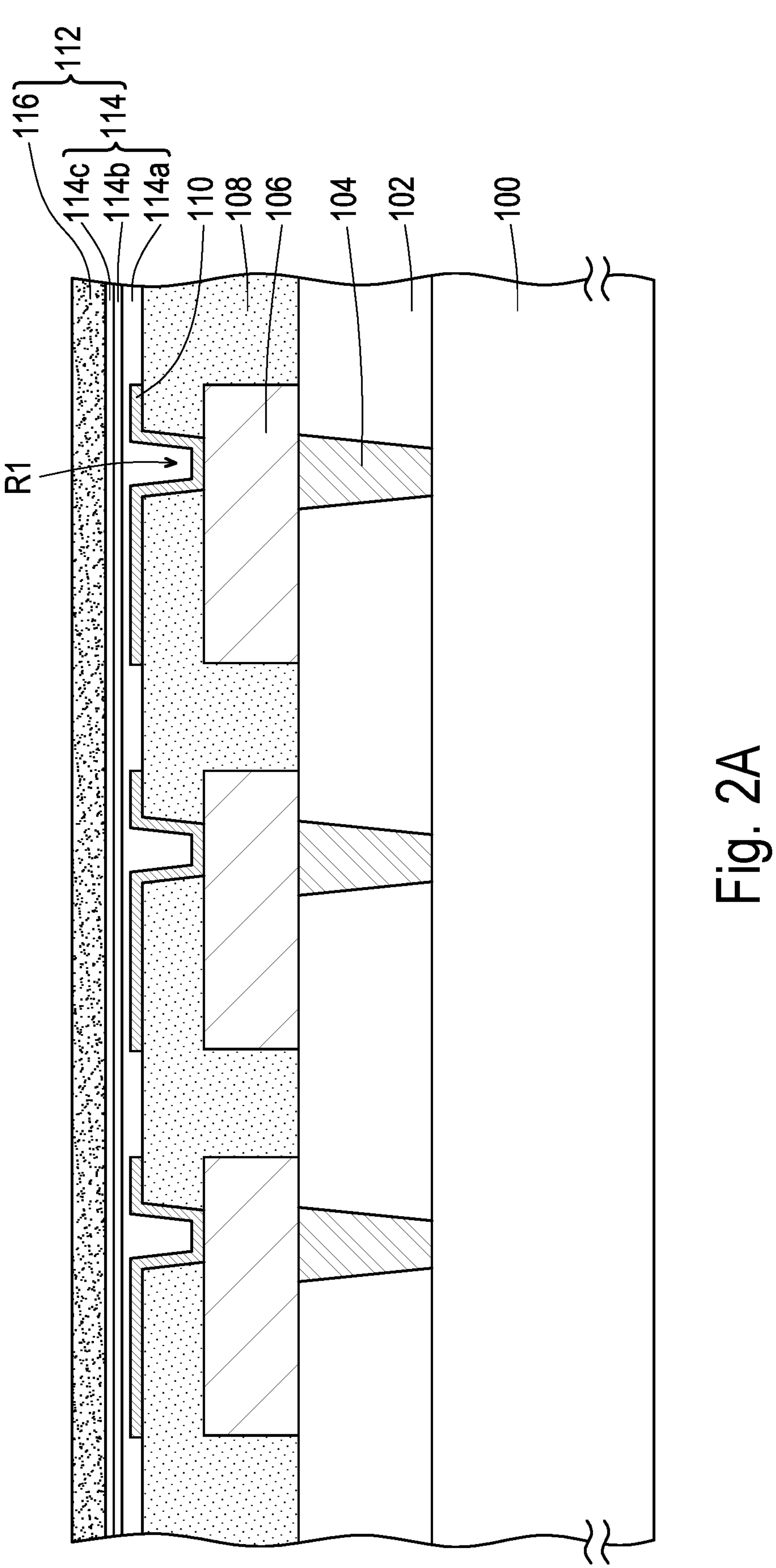
FIG. 2A to FIG. 2E are cross-sectional views of manufacturing processes of semiconductor structures according to other embodiments of the disclosure.
Figure 2B:
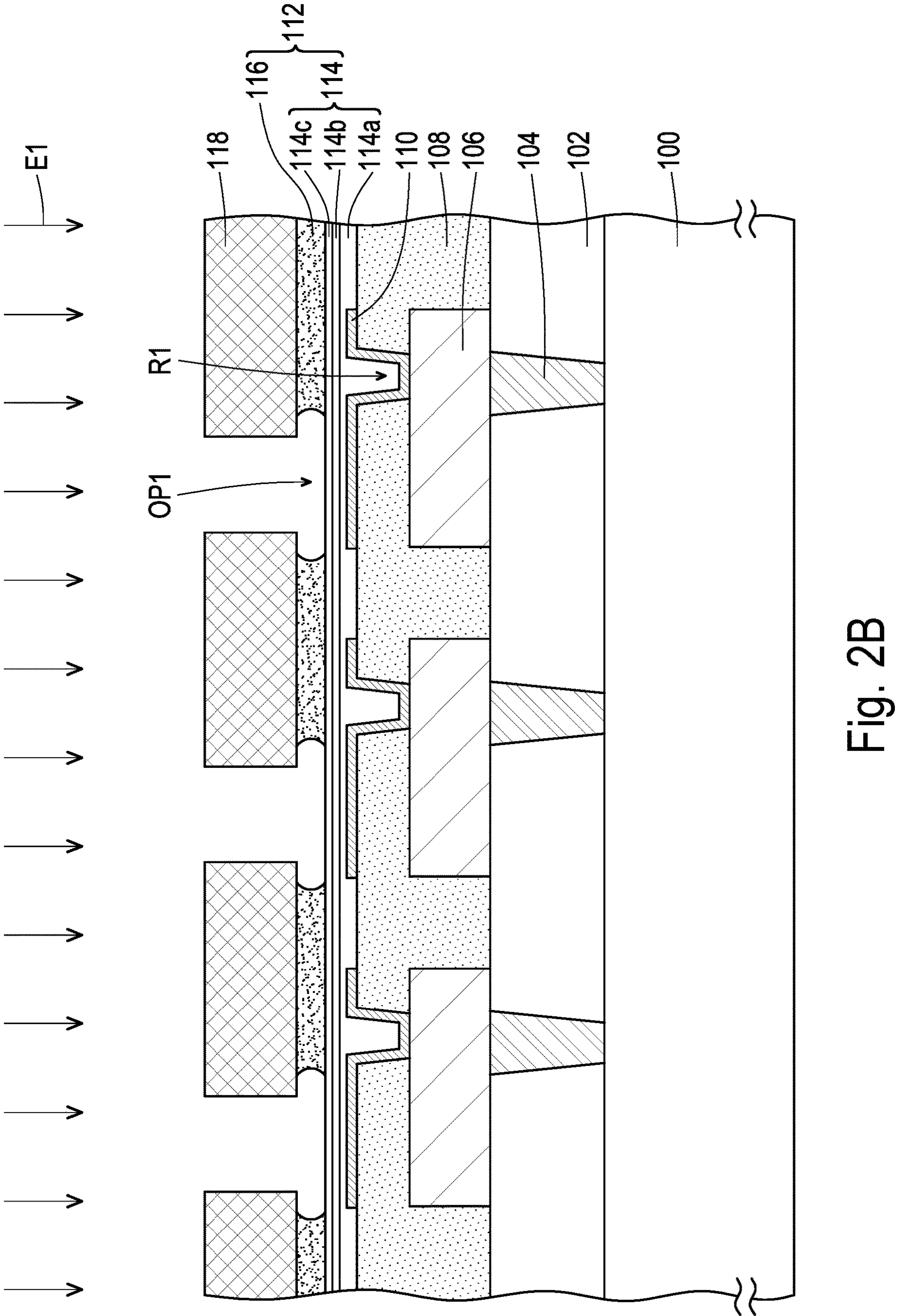

Next, a definition layer 112 is formed on the substrate 100. In some embodiments, the definition layer 112 may be formed on the dielectric layer 108 and the conductive layer 110. In some embodiments, the definition layer 112 may be used as a pixel definition layer. The definition layer 112 includes a dielectric layer 114 and a dielectric layer 116. The dielectric layer 114 is located on the substrate 100. In this embodiment, as shown in FIG. 1A, the dielectric layer 114 may be a single-layer structure, but the disclosure is not limited thereto. In other embodiments, as shown in FIG. 2A, the dielectric layer 114 may be a multi-layer structure. In some embodiments, the dielectric layer 114 may be formed on the dielectric layer 108 and the conductive layer 110. In some embodiments, the dielectric layer 114 may fill the recess R1. In some embodiments, a material of the dielectric layer 114 is silicon oxide, but the disclosure is not limited thereto. In some embodiments, the dielectric layer 114 is formed by a chemical vapor deposition method, for example. The dielectric layer 116 is located on the dielectric layer 114. In some embodiments, a material of the dielectric layer 116 is, for example, silicon nitride, but the disclosure is not limited thereto. In some embodiments, a forming method of the dielectric layer 116 is, for example, chemical vapor deposition method.

In addition, although not shown in FIG. 1A, the substrate 100 may have a semiconductor element (e.g., an active element and/or a passive element), other dielectric layer, and/or an interconnect structure, and other required components, the description of which is hereby omitted. In addition, the plug 104 may be electrically connected to a corresponding interconnect structure (not shown) or a semiconductor element (not shown).

Figure 1B:
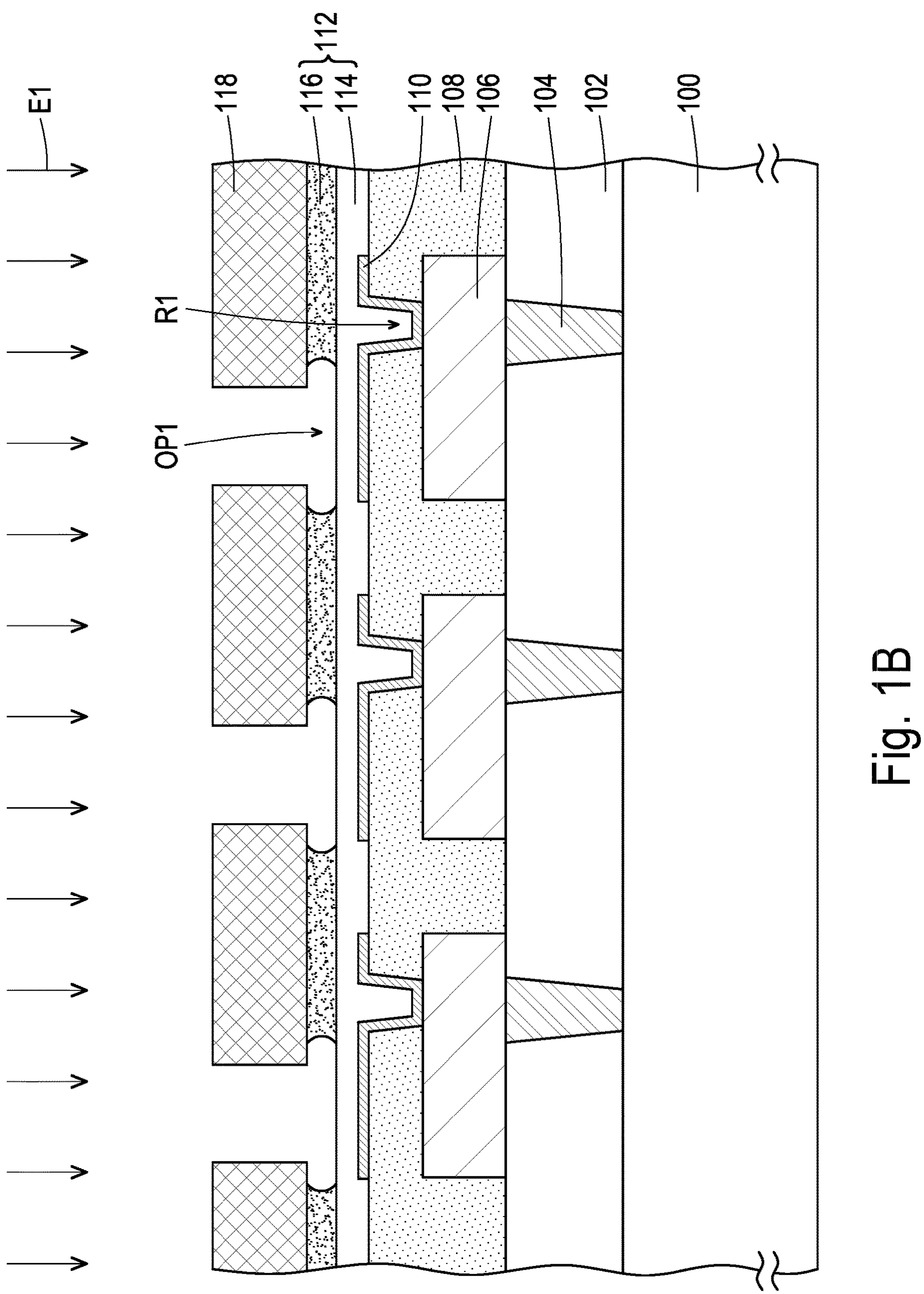

Referring to FIG. 1B, a patterned photoresist layer 118 is formed on the dielectric layer 116. In some embodiments, the patterned photoresist layer 118 may be formed by lithography.

Next, an isotropic etching process E1 is performed on the dielectric layer 116 by using the patterned photoresist layer 118 as a mask to form an opening OP1 in the dielectric layer 116. A portion of the opening OP1 is located under the patterned photoresist layer 118. In some embodiments, in the isotropic etching process E1, an etching rate of the dielectric layer 116 may be greater than an etching rate of the dielectric layer 114. In some embodiments, the isotropic etching process E1 may be a wet etching process.

Figure 1C:
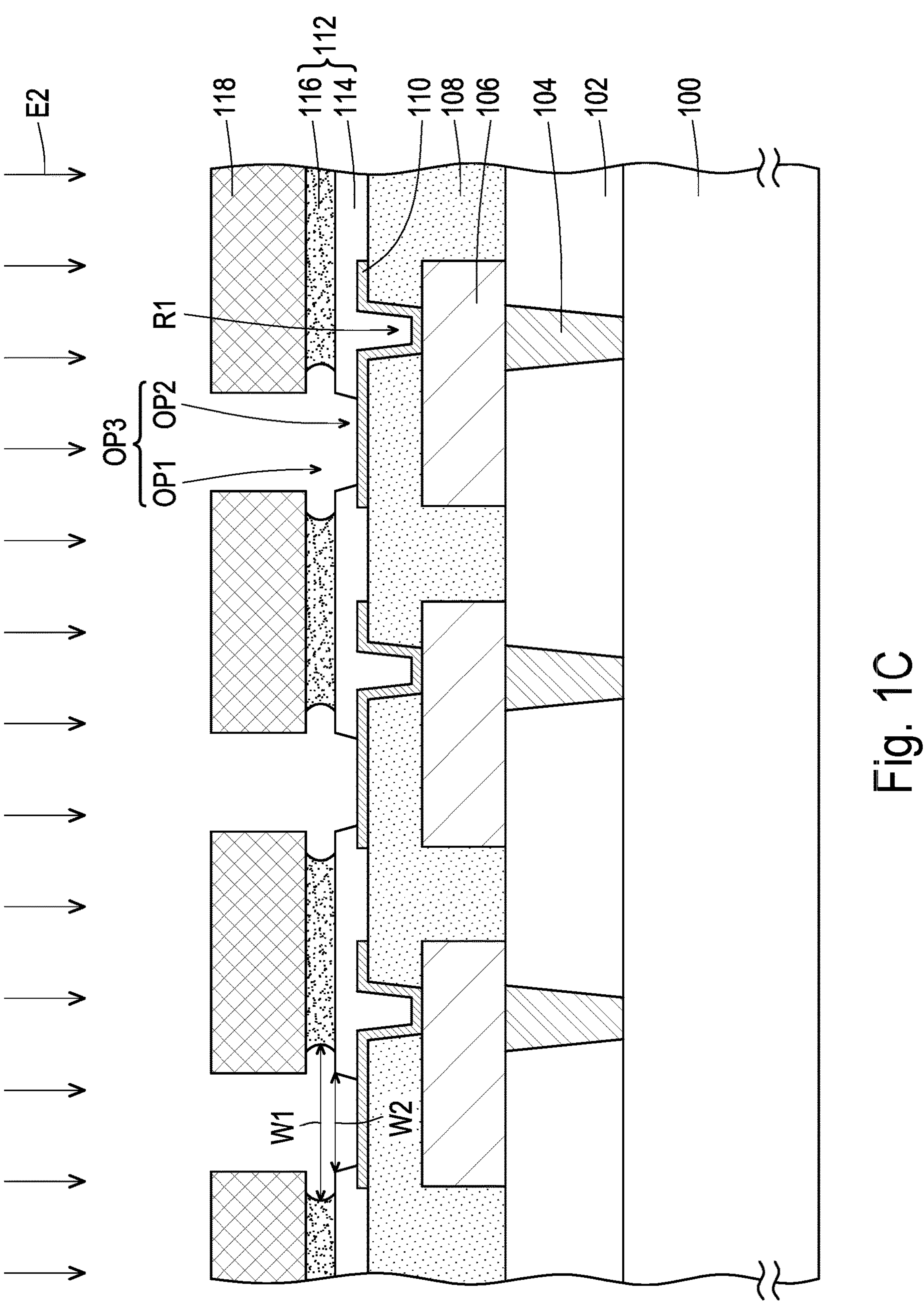

Referring to FIG. 1C, an anisotropic etching process E2 is performed on the dielectric layer 114 by using the patterned photoresist layer 118 as a mask to form an opening OP2 in the dielectric layer 114. The opening OP1 is connected to the opening OP2 to form an opening OP3 in the definition layer 112. In some embodiments, the opening OP3 may expose the conductive layer 110. In some embodiments, a maximum width W1 of opening OP1 may be greater than a maximum width W2 of opening OP2. In some embodiments, the anisotropic etching process E2 may be a dry etching process.

Figure 1D:
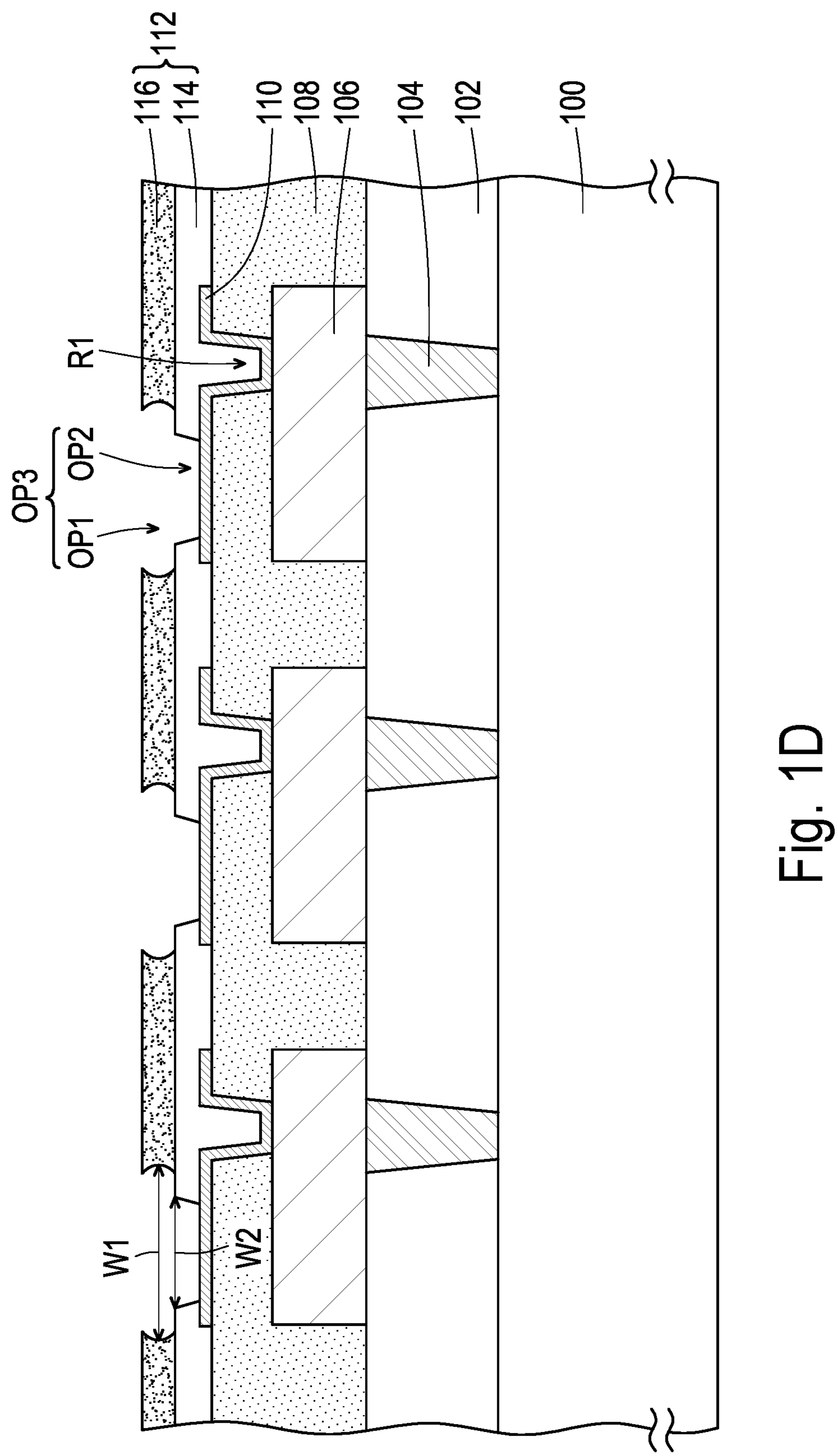

Referring to FIG. 1D, the patterned photoresist layer 118 is removed. In some embodiments, a removal method of the patterned photoresist layer 118 is, for example, dry stripping or wet stripping.

Figure 1E:
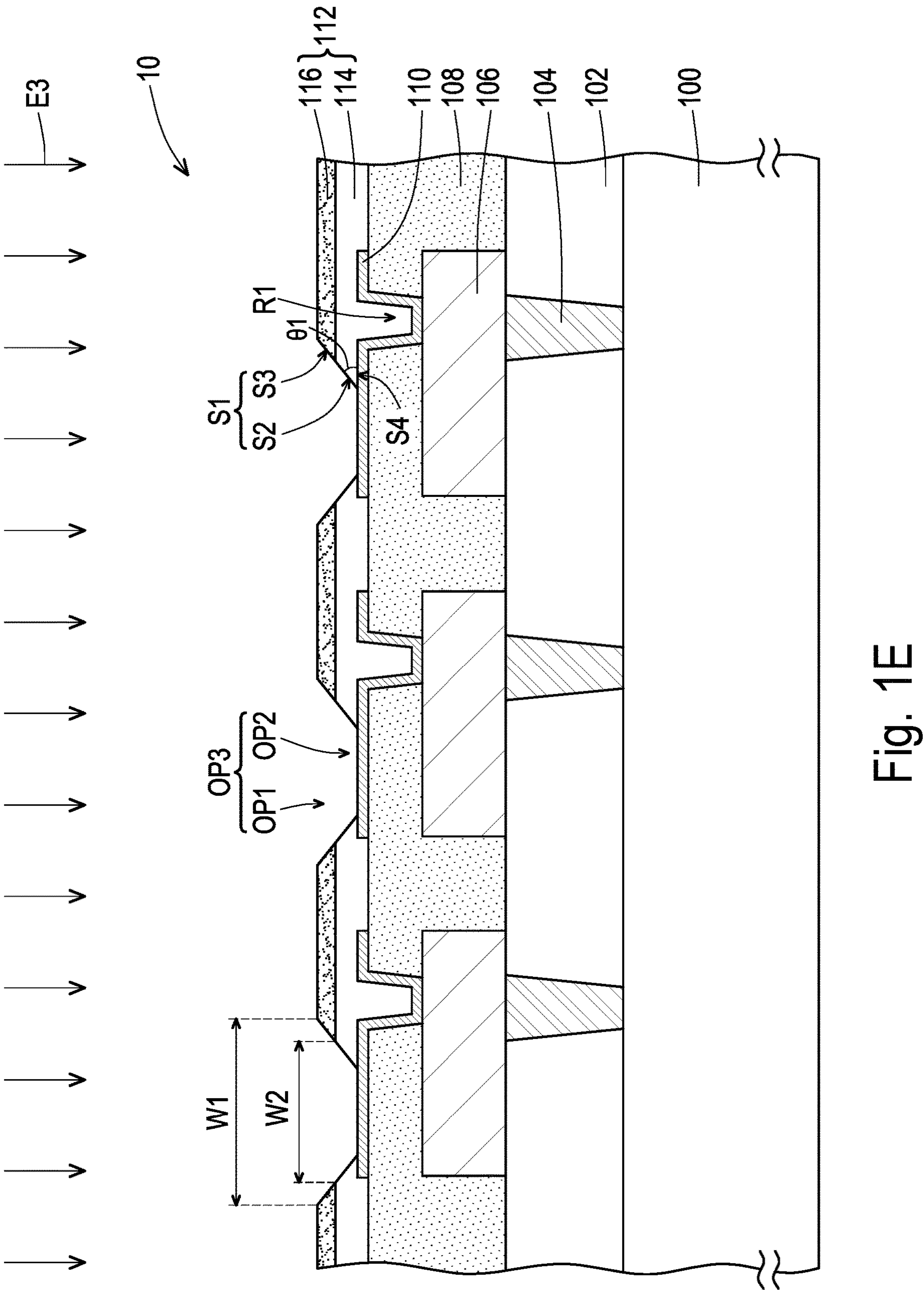

Referring to FIG. 1E, an etch back process E3 is performed on the dielectric layer 114 and the dielectric layer 116, so that a sidewall S1 of the definition layer 112 exposed by the opening OP3 is an inclined surface. In some embodiments, the sidewall S1 of the definition layer 112 may include a sidewall S2 of the dielectric layer 114 and a sidewall S3 of the dielectric layer 116. In some embodiments, an angle θ1 between the sidewall S1 of the definition layer 112 and a lower surface S4 of the definition layer 112 may be 20 degrees to 60 degrees. In some embodiments, the angle θ1 between the sidewall S1 of the definition layer 112 and the lower surface S4 of the definition layer 112 may be 30 degrees to 50 degrees.

In some embodiments, the method of performing the etch back process E3 on the dielectric layer 114 and the dielectric layer 116 may include that an isotropic etching process is performed on the dielectric layer 114 and the dielectric layer 116. In some embodiments, the isotropic etching process may be a wet etching process. In some other embodiments, the method of performing the etch back process E3 on the dielectric layer 114 and the dielectric layer 116 may include that an anisotropic etching process is performed on the dielectric layer 114 and the dielectric layer 116. In some embodiments, the anisotropic etching process may be a dry etching process.

Based on the above embodiments, it can be seen that in the manufacturing method of the semiconductor structure 10, the definition layer 112 is formed on the substrate 100. The definition layer 112 includes the dielectric layer 114 and the dielectric layer 116. The isotropic etching process E1 is performed on the dielectric layer 116 by using the patterned photoresist layer 118 as a mask to form the opening OP1 in the dielectric layer 116. A portion of the opening OP1 is located under the patterned photoresist layer 118. The anisotropic etching process E2 is performed on the dielectric layer 114 by using the patterned photoresist layer 118 as a mask to form the opening OP2 in the dielectric layer 114. The opening OP1 is connected to the opening OP2 to form the opening OP3 in the definition layer 112. After the patterned photoresist layer 118 is removed, the etch back process E3 is performed on the dielectric layer 114 and dielectric layer 116. The etch back process E3 may eliminate a sharp corner of the dielectric layer 114 and a sharp corner of the dielectric layer 116, so that the sidewall S1 of the definition layer 112 exposed by the opening OP3 is an inclined surface. Since the sidewall S1 of the definition layer 112 formed by the method has a gentle slope, fracture of components (e.g., OLED layers and/or cathodes) subsequently formed on the definition layer 112 may be effectively prevented, thereby enhancing reliability of a semiconductor element (e.g., a silicon-based OLED element).

FIG. 2A to FIG. 2E are cross-sectional views of manufacturing processes of semiconductor structures according to other embodiments of the disclosure. Referring to FIG. 1A to FIG. 1E and FIG. 2A to FIG. 2E. The manufacturing method of the semiconductor structure 10 in FIG. 1A to FIG. 1E and a manufacturing method of a semiconductor structure 20 in FIG. 2A to FIG. 2E differ as follows. As shown in FIG. 2A, the dielectric layer 114 may be a multi-layer structure. In some embodiments, a material of the dielectric layer 114 is, for example, a low dielectric constant (low-k) material, an ultra-low-k (ULK) material, or phosphosilicate glass (PSG), organic dielectric layer (ODL), or a combination thereof. In some embodiments, the dielectric layer 114 may include multiple dielectric material layers. For example, as shown in FIG. 2A, the dielectric layer 114 may include a dielectric material layer 114*a*, a dielectric material layer 114*b*, and a dielectric material layer 114*c*, but the disclosure is not limited thereto. When the dielectric layer 114 has a multi-layer structure, as long as the dielectric layer 114 includes multiple dielectric material layers, it falls within the scope of the disclosure. The dielectric material layer 114*a* is located on the substrate 100. In some embodiments, the dielectric material layer 114*a* may be located on the dielectric layer 108 and the conductive layer 110. The dielectric material layer 114*b* is located on the dielectric material layer 114*a*. The dielectric material layer 114*c* is located on the dielectric material layer 114*b*. In some embodiments, a material of the dielectric material layer 114*a* is, for example, phosphosilicate glass (PSG), a material of the dielectric material layer 114*b* is, for example, a low dielectric constant (low-k) material, and a material of the dielectric material layer 114*c* is, for example, an ultra-low-k (ULK) material, and a material of the dielectric layer 116 is, for example, silicon nitride.

Figure 2C:
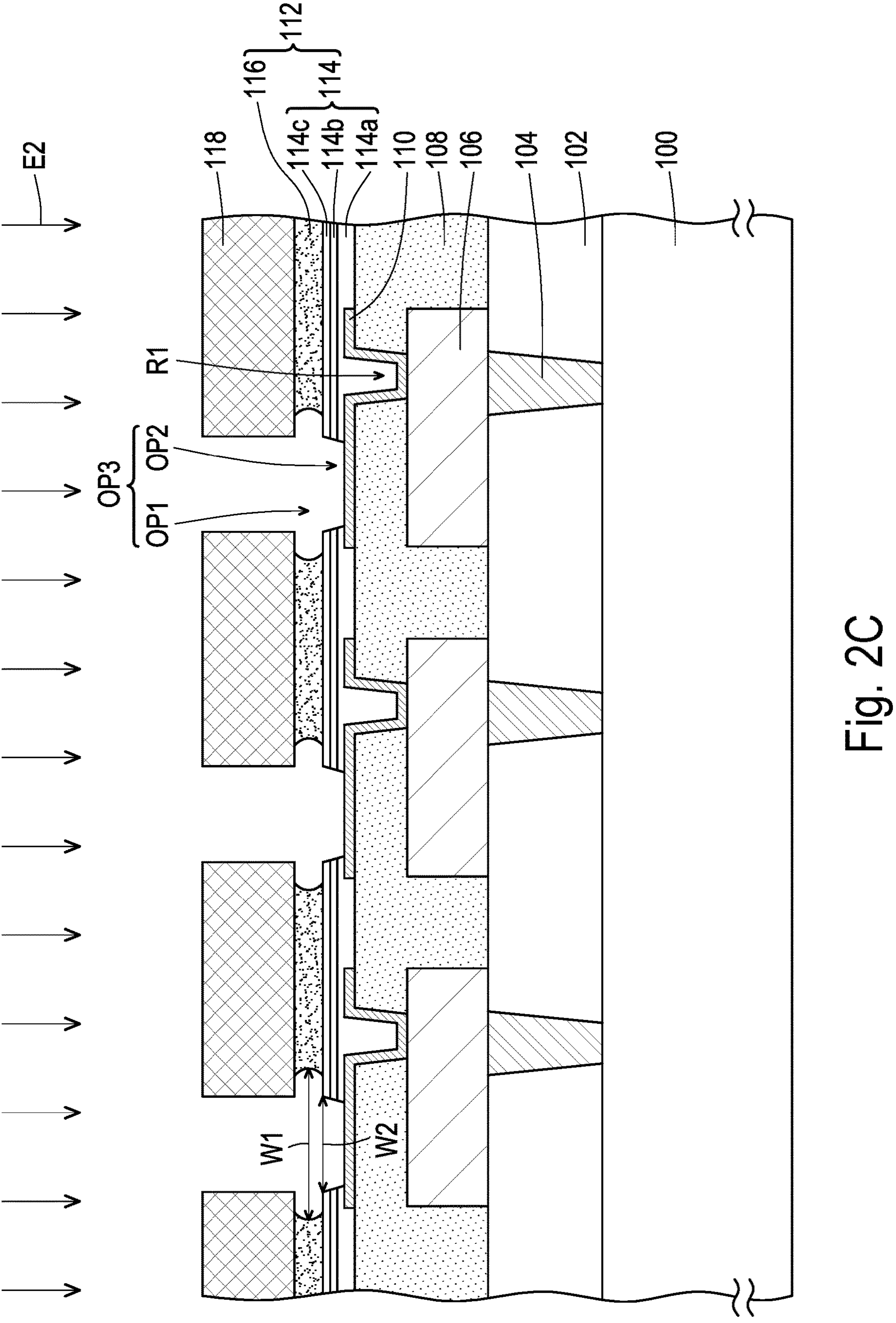
Figure 2D:
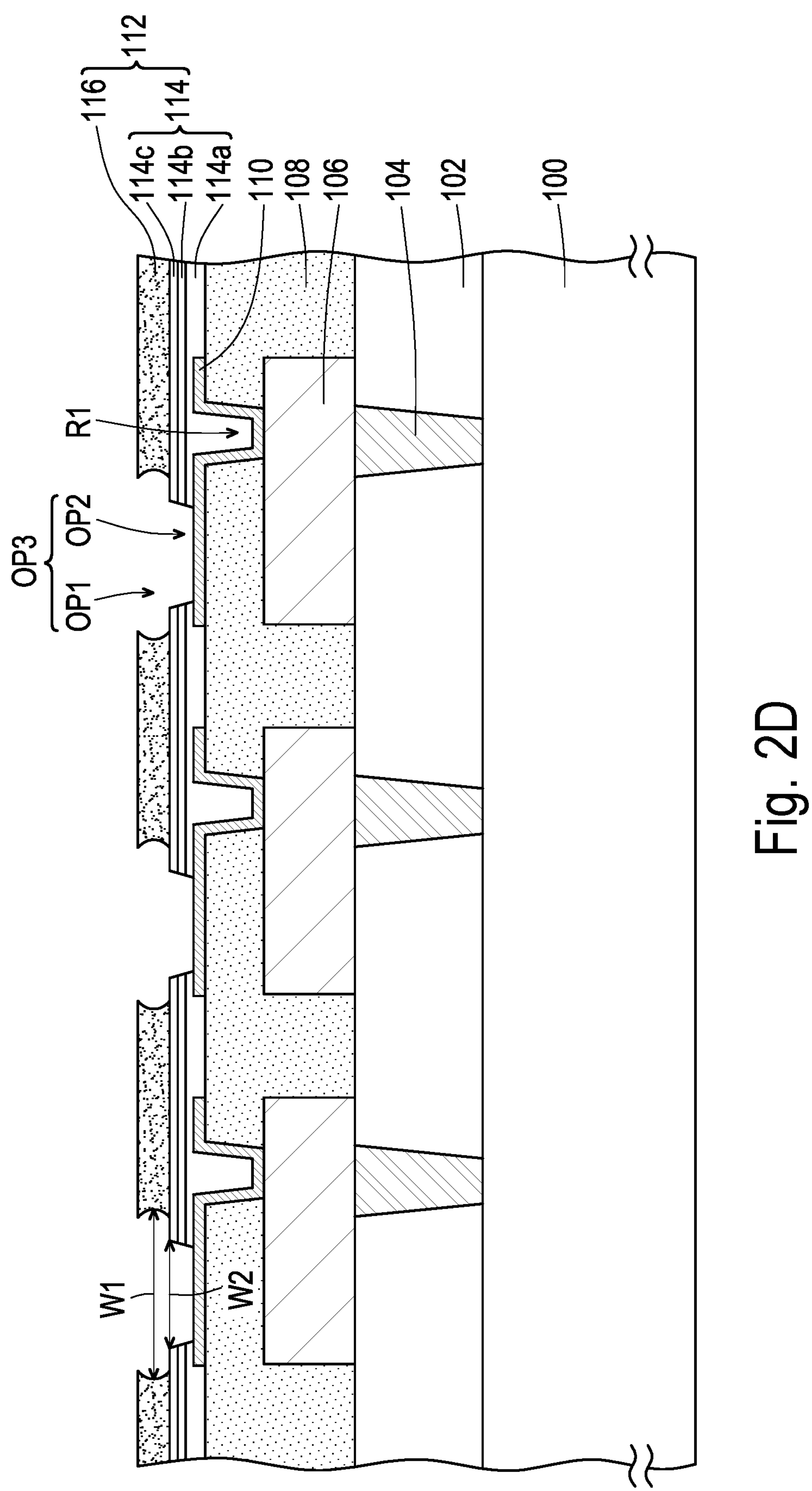

In the anisotropic etching process E2 of FIG. 2C, multiple etching rates of the dielectric material layers of the dielectric layer 114 (e.g., the dielectric material layer 114*a*, the dielectric material layer 114*b*, and the dielectric material layer 114*c*) may decrease from an uppermost layer (e.g., the dielectric material layer 114*c*) of the dielectric material layers to a lowermost layer (e.g., the dielectric material layer 114*a*) of the dielectric material layers. For example, in the anisotropic etching process E2 of FIG. 2C, an etching rate of the dielectric material layer 114*c* is greater than an etching rate of the dielectric material layer 114*b*, and an etching rate of the dielectric material layer 114*b* is greater than an etching rate of the dielectric material layer 114*a*.

Figure 2E:
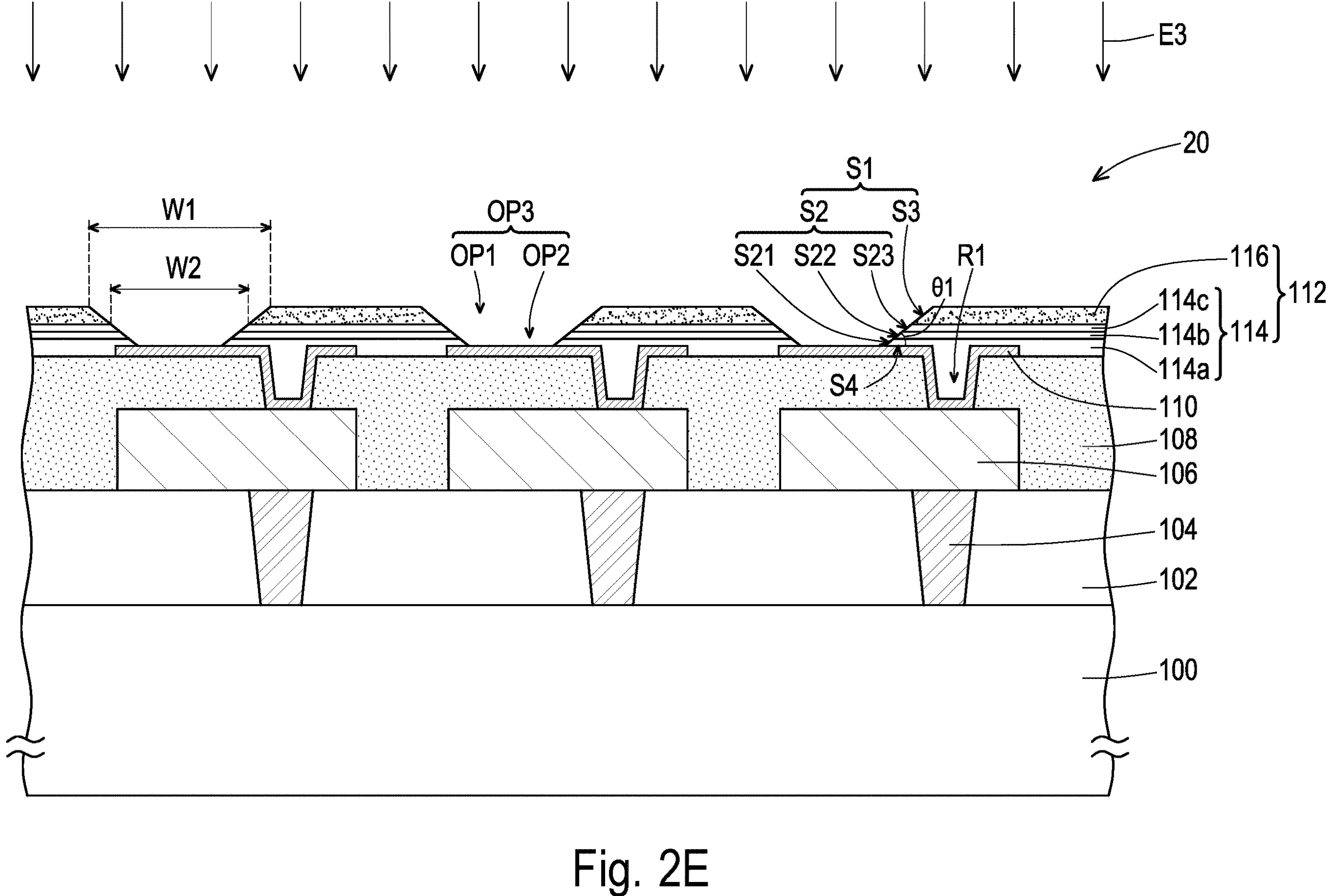

In FIG. 2E, the sidewall S1 of the definition layer 112 may include the sidewall S2 of the dielectric layer 114 and the sidewall S3 of the dielectric layer 116, and the sidewall S2 of the dielectric layer 114 may include a sidewall S21 of the dielectric material layer 114*a*, a sidewall S22 of the dielectric material layer 114*b*, and a sidewall S23 of the dielectric material layer 114*c*.

Except for the above differences, the manufacturing method of the semiconductor structure 20 can refer to the description of the manufacturing method of the semiconductor structure 10 in the above-mentioned embodiments, and will not be repeated in the following. In addition, in FIG. 1A to FIG. 1E and FIG. 2A to FIG. 2E, the same or similar components are represented by the same symbols, and will not be repeated in the following.

Based on the above-mentioned embodiments, it can be seen that in the manufacturing method of the semiconductor structure 20, the definition layer 112 is formed on the substrate 100. The definition layer 112 includes the dielectric layer 114 and the dielectric layer 116. The isotropic etching process E1 is performed on the dielectric layer 116 by using the patterned photoresist layer 118 as a mask to form the opening OP1 in the dielectric layer 116. A portion of the opening OP1 is located under the patterned photoresist layer 118. The anisotropic etching process E2 is performed on the dielectric layer 114 by using the patterned photoresist layer 118 as a mask to form the opening OP2 in the dielectric layer 114. The opening OP1 is connected to the opening OP2 to form the opening OP3 in definition layer 112. After the patterned photoresist layer 118 is removed, the etch back process E3 is performed on the dielectric layer 114 and dielectric layer 116. The etch back process E3 may eliminate a sharp corner of the dielectric layer 114 and a sharp corner of the dielectric layer 116, so that the sidewall S1 of the definition layer 112 exposed by the opening OP3 is an inclined surface. Since the sidewall S1 of the definition layer 112 formed by the method has a gentle slope, fracture of components (e.g., OLED layers and/or cathodes) subsequently formed on the definition layer 112 may be effectively prevented, thereby enhancing reliability of a semiconductor element (e.g., a silicon-based OLED element).

In summary, the manufacturing method of the semiconductor structure of the embodiments may effectively prevent components (e.g., OLED layers and/or cathodes) subsequently formed on the definition layer from fracturing, thereby enhancing reliability of the semiconductor element (e.g., a silicon-based OLED element).

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor structure, comprising:

providing a substrate;

forming a definition layer on the substrate, wherein the definition layer comprises;

a first dielectric layer located on the substrate; and a second dielectric layer located on the first dielectric layer;

forming a patterned photoresist layer on the second dielectric layer;

performing a first isotropic etching process on the second dielectric layer by using the patterned photoresist layer as a mask to form a first opening in the second dielectric layer, wherein a portion of the first opening is under the patterned photoresist layer;

performing a first anisotropic etching process on the first dielectric layer by using the patterned photoresist layer as a mask to form a second opening in the first dielectric layer, wherein the first opening is connected to the second opening to form a third opening in the definition layer;

removing the patterned photoresist layer;

performing an etch back process on the first dielectric layer and the second dielectric layer, such that a sidewall of the definition layer exposed by the third opening is an inclined surface;

forming an electrode layer on the substrate;

forming a third dielectric layer on the electrode layer; and forming a conductive layer on the third dielectric layer, wherein the conductive layer is electrically connected to the electrode layer, the first dielectric layer is formed on the third dielectric layer and the conductive layer, the conductive layer has a recess, and the first dielectric layer fills the recess.

2. The manufacturing method of a semiconductor structure according to claim 1, wherein in the first isotropic etching process, an etching rate of the second dielectric layer is greater than an etching rate of the first dielectric layer.

3. The manufacturing method of a semiconductor structure according to claim 1, wherein the first dielectric layer comprises a single-layer structure.

4. The manufacturing method of a semiconductor structure according to claim 1, wherein the first dielectric layer comprises a multi-layer structure.

5. The manufacturing method of a semiconductor structure according to claim 4, wherein the first dielectric layer comprises a plurality of dielectric material layers.

6. The manufacturing method of a semiconductor structure according to claim 5, wherein in the first anisotropic etching process, a plurality of etching rates of the dielectric material layers decrease from an uppermost layer of the dielectric material layers to a lowermost layer of the dielectric material layers.

7. The manufacturing method of a semiconductor structure according to claim 1, wherein an angle between the sidewall of the definition layer and a lower surface of the definition layer is 20 degrees to 60 degrees.

8. The manufacturing method of a semiconductor structure according to claim 1, wherein an angle between the sidewall of the definition layer and a lower surface of the definition layer is 30 degrees to 50 degrees.

9. The manufacturing method of a semiconductor structure according to claim 1, wherein a maximum width of the first opening is greater than a maximum width of the second opening.

10. The manufacturing method of a semiconductor structure according to claim 1, wherein the first isotropic etching process comprises a wet etching process.

11. The manufacturing method of a semiconductor structure according to claim 1, wherein the first anisotropic etching process comprises a dry etching process.

12. The manufacturing method of a semiconductor structure according to claim 1, wherein the sidewall of the definition layer comprises a sidewall of the first dielectric layer and a sidewall of the second dielectric layer.

13. The manufacturing method of a semiconductor structure according to claim 1, wherein performing an etch back process on the first dielectric layer and the second dielectric layer comprises performing a second isotropic etching process on the first dielectric layer and the second dielectric layer.

14. The manufacturing method of a semiconductor structure according to claim 13, wherein the second isotropic etching process comprises a wet etching process.

15. The manufacturing method of a semiconductor structure according to claim 1, wherein performing an etch back process on the first dielectric layer and the second dielectric layer comprises performing a second anisotropic etching process on the first dielectric layer and the second dielectric layer.

16. The manufacturing method of a semiconductor structure according to claim 15, wherein the second anisotropic etching process comprises a dry etching process.

17. The manufacturing method of a semiconductor structure according to claim 1, wherein the third opening exposes the conductive layer.

18. The manufacturing method of the semiconductor structure according to claim 1 further comprising:

forming a fourth dielectric layer on the substrate; and forming a plug in the fourth dielectric layer, wherein the electrode layer and the third dielectric layer are formed on the fourth dielectric layer, and the electrode layer is electrically connected to the plug.

* * * * *